United States Patent [19]

Walpita et al.

[11] Patent Number: 5,739,193
[45] Date of Patent: Apr. 14, 1998

[54] POLYMERIC COMPOSITIONS HAVING A TEMPERATURE-STABLE DIELECTRIC CONSTANT

[75] Inventors: Lak M. Walpita, Basking Ridge; Paul N. Chen, Sr., Gillette; Harris A. Goldberg, Edison; Christopher Zipp, Verona, all of N.J.

[73] Assignee: Hoechst Celanese Corp., Somerville, N.J.

[21] Appl. No.: 646,403

[22] Filed: May 7, 1996

[51] Int. Cl.$^6$ .................................................. C08K 3/10
[52] U.S. Cl. ........................... 524/413; 361/321.4
[58] Field of Search .................. 361/321.4; 524/413

[56] References Cited

U.S. PATENT DOCUMENTS

| | | | |
|---|---|---|---|
| 4,335,180 | 6/1982 | Traut et al. | 428/303 |
| 4,798,863 | 1/1989 | Leland et al. | 524/413 |
| 4,845,062 | 7/1989 | Burn | 501/136 |
| 5,154,973 | 10/1992 | Imagawa et al. | 428/325 |
| 5,358,775 | 10/1994 | Horn et al. | 428/209 |
| 5,431,955 | 7/1995 | Kawamura et al. | 427/126.2 |
| 5,552,210 | 9/1996 | Horn et al. | 428/209 |

FOREIGN PATENT DOCUMENTS

| | | |
|---|---|---|
| 3242657 | 5/1983 | Germany . |
| 4-161461 | 6/1992 | Japan . |
| 5-057853 | 3/1993 | Japan . |
| 5-98069 | 4/1993 | Japan . |
| 5-307911 | 11/1993 | Japan . |
| WO 92/18213 | 10/1992 | WIPO . |

OTHER PUBLICATIONS

S. Asai, et al., "Fabrication of an Insulated Metal Substrate having an Insulating layer with a High Dilectric Constant" IEEE Transactions on Components, Hybrids and Manufacturing Technology, vol. 16, No.5, Aug., 1993, pp. 499–504.

Primary Examiner—Edward J. Cain
Attorney, Agent, or Firm—James L. McGinnis

[57] ABSTRACT

A polymeric composition having a high dielectric constant which varies little with temperature is made from a thermoplastic polymer, a high dielectric ceramic having a dielectric constant of at least about 50 at 1.0 Ghz and 20° C., and a second ceramic material having a dielectric constant of at least about 5.0 at 1.0 GHz and 20° C., where the high dielectric ceramic and the second ceramic material have temperature coefficients that are opposite in sign from one another.

28 Claims, No Drawings

POLYMERIC COMPOSITIONS HAVING A TEMPERATURE-STABLE DIELECTRIC CONSTANT

RELATED APPLICATIONS

Commonly assigned U.S. Application No. 08/646,207 filed on even date herewith, contains related subject matter.

FIELD OF THE INVENTION

This invention relates generally to the field of materials having a high dielectric constant, and more particularly to filled thermoplastic polymers that have a high dielectric constant that changes little with temperature.

BACKGROUND OF THE INVENTION

New materials with high dielectric constants and low loss tangents are needed in the electronics industry for use at high frequencies and as a means to enable further miniaturization. These materials are particularly useful if they can be made into thin films, sheets, plaques, and other molded shapes, so that they can be used as circuit boards at microwave frequencies, high energy density capacitors, filters, antennas, buried components, and multichip modules. These have a variety of end uses, as for example in wireless communications. Many ceramic materials have the desired high dielectric constant and low dielectric loss, but they are not readily made into thin films. Ceramic materials that have been fabricated into films and shaped articles are also generally brittle.

One approach to making films and sheets with the desired properties is to utilize a composite comprising a polymeric matrix and a ceramic filler having a high dielectric constant. This approach is difficult because the composites need high levels of the ceramic filler in order to achieve the desired high dielectric constant while retaining rheological properties that make the composites suitable for extrusion or molding. The composites must also be stable to changes in ambient moisture (humidity) and temperature. Resistance to elevated temperatures, as well as high mechanical strength, impact resistance and chemical resistance are also all desirable. Finally, in many applications, flat substrates made from these materials will need to be made into laminates with copper and/or other materials.

Several high dielectric constant materials based on polymers combined with ceramics are known. For example, numerous patents are assigned to Rogers Corporation that teach composites of fluoropolymers, preferably poly (tetrafluoroethylene) (PTFE), and ceramic materials for use as high dielectric materials, as for example U.S. Pat. No. 4,335,180 and 5,358,775. Rogers Corporation sells a composite of PTFE and a ceramic filler for use as a high dielectric film. It is in general difficult to make thin films and other shaped articles of PTFE containing a filler.

Other examples of high dielectric composite materials are disclosed in U.S. Pat. No. 5,174,973, which describes generally composites that can be based on any of several different polymers and any of several different ceramic materials. German patent publication DE 3,242,657, describes a composite of $BaTiO_3$ in poly(ethylene terephthalate). Japanese patent publication JP 5,307,911 describes the utility of using a metal-coated ceramic powder (e.g. $BaTiO_3$) in an epoxy substrate. The metal coating increases the permittivity. Japanese patent publication JP 57,853 describes composites of poly(phenylene oxide) and $TiO_2$. Finally, Japanese patent publication JP 98,069 discloses composites of $BaTiO_3$ in poly(phenylene sulfide); a low molecular weight heat resistant oil is added to the polymer composite to improve its processability in the melt.

Finally, a high dielectric composite in which the matrix polymer is an epoxy resin based on bisphenol F epoxy and an organic amino curing agent and in which the filler is barium titanate at a 34 volume % level has been described (S. Asai, et al., IEEE Transactions on Components, Hybrids and Manufacturing Technology, Vol. 16, No. 5, Aug., 1993, pp. 499–504). This composite was easy to process before the epoxy resins set because of the low viscosity of the epoxy prepolymer, and dielectric constants up to about 20 and loss tangents of about 0.0165–0.0173 were observed with this composite.

A problem that still needs to be solved is the temperature stability of the dielectric constant. The dielectric constants of high dielectric ceramics change with temperature. As a result, the dielectric constants of the composites also change with temperature. The change in dielectric constant affects the electrical properties of electronic components utilizing the composites such as, for example, the resonant frequency of a patch antenna. This may limit the usefulness of the devices, since they are only usable within limited temperature ranges. Outdoor use may not be reliable. This problem is solved by the current invention.

SUMMARY OF THE INVENTION

A polymeric composition which has a high dielectric constant with a low temperature coefficient is made from a thermoplastic polymer, a high dielectric ceramic having a dielectric constant of at least about 50 at 1.0 GHz and 20° C., and a second ceramic material which has a dielectric constant of at least about 5.0 at 1.0 GHz and 20° C. The high dielectric ceramic and the second ceramic material have temperature coefficients that are opposite in sign from one another. In other words, the dielectric constant of either the high dielectric ceramic or the second ceramic material increases with increasing temperature, while the dielectric constant of the other of the high dielectric ceramic and the second ceramic material decreases with increasing temperature. Thus, the changes in dielectric constant with temperature tend to offset one another, and the temperature coefficient (i.e. the temperature dependence of the dielectric constant) of the composite is reduced. The use of this method is sometimes referred to hereafter as "temperature compensation". In general, the fillers are used to raise the dielectric constant of the plastic, so that the dielectric constant of the composition is at least about 4.0 at 1.0 GHz and 20° C. With temperature compensation, the dielectric constant of the polymeric composition does not vary over the temperature range from –40° C. to 85° C. by more than about 2% above or below the dielectric constant at 20° C. and 1.0 GHz, and ideally not by more than about 1%, and optimally not by more than 0.5%.

The polymeric compositions described above may be used in "laminates" having a high dielectric constant with a reduced temperature coefficient (i.e. a smaller change in dielectric constant with temperature). The laminates contain flat substrates which are made from the polymeric compositions described above. The flat substrates have two surfaces (other than the edges). There is at least one layer of metal adhering to at least one surface of the substrate. The laminate has a dielectric constant of at least about 4.0 at 1.0 GHz frequency and 20° C., which does not change by more about 2%, and preferably by not more than about 1%, over the temperature range –40° C. to 85° C. The laminates can have multiple layers of the thermoplastic composition alternating with layers of metal between the layers of thermoplastic composite.

The invention also can be viewed as a method of making a polymeric composition having a high dielectric constant with a reduced temperature coefficient. The method involves the compounding of a thermoplastic polymer, a high dielectric ceramic, and a second ceramic material, all of which were described previously, where the dielectric constant of either the high dielectric ceramic or the second ceramic material increases with increasing temperature and the dielectric constant of the other of the high dielectric ceramic or the second ceramic material decreases with increasing temperature. Sufficient quantities of the high dielectric ceramic and the second ceramic material are compounded with the thermoplastic polymer so that the dielectric constant of the resulting polymeric composition is at least about 4.0 at 1.0 GHz and 20° C.

Finally, the invention is also a method of making a laminate having a high dielectric constant with a reduced temperature coefficient by the steps of shaping the polymeric composition described above into a flat substrate and applying metal to one or both surfaces of the substrate. "Shaping" means any process for making a polymer or polymer composition into a fabricated product, such as sheet, film, or three dimensional object. Such processes include extrusion, injection molding, calendaring, compression molding, and the like. The compositions comprising a polymer and a ceramic or other filler having a high dielectric constant are also referred to herein as "high dielectric composites" and "high dielectric constant composites."

DETAILED DESCRIPTION OF THE INVENTION

The combination of thermoplastic polymer, high dielectric ceramic, and a second ceramic material provides polymeric compositions that have high dielectric constants that are relatively constant with changing temperature. This makes them particularly useful in devices that may be exposed to large ranges of temperatures (e.g. outdoor use). The large amount of filler also gives the compositions a low coefficient of thermal expansion (CTE) compared the unfilled polymer. The reduced CTE makes the compositions more suitable for lamination with copper because there is less of a mismatch in CTE between the polymer composition and copper, resulting in fewer problems with warping, delamination, and the like. The use of a thermoplastic polymer also makes the compositions easier to fabricate, since they can be shaped by such common methods as injection molding and extrusion.

The choice of a polymer to be used depends on the properties that are desired (e.g. thermal properties, loss tangent). If temperature performance is not important, then a polymer that results in a polymeric composition (after adding the fillers) having an HDT of at least about 80° C. under a 264 psi load by ASTM Test Method D648 is sufficient. If higher temperature performance is needed, then the composition should have an HDT of at least about 200° C. when measured under the conditions described above.

The polymers that are used can be semi-crystalline, amorphous, or liquid crystalline. The semi-crystalline polymers generally will have a melting point of at least about 200° C. if temperature stability is important. The amorphous polymers will generally have a glass transition temperature of at least about 80° C. Thermotropic liquid crystalline polymers will usually have a melting point of at least about 200° C.

A partial list of thermoplastic polymers that may be used in the temperature compensated products follows: polyethylene, ultra-high-molecular weight polyethylene, polystyrene, poly(oxymethylene) (e.g. CELCON® acetal resin from Hoechst Celanese Corporation), polycarbonate, poly(phenylene oxide) (available from G.E. Plastics), poly-etherimide (e.g. ULTEM™ resin, from G.E. Plastics), polysulfone, poly(ethersulfone) (available from BASF), nylon 6, nylon 66, poly(ethylene terephthalate), poly(1,4-cyclohexanedimethylene terephthalate) (i.e. the copolymer of cis and trans 1,4-cyclohexanedimethanol and terephthalic acid, available from Eastman Chemicals as THERMX™), poly(ethylene naphthalate), poly(phenylene sulfide) (e.g. FORTRON® resin from Hoechst Celanese Corporation), poly(amideimide), polyetheretherketone (i.e. PEEK, available from ICI Americas), poly(etherketone), cycloolefinic copolymer (made by vinyl polymerization of norbornene and ethylene, currently available from Mitsui Petrochemicals Industry, Ltd. under the name APEL™), thermotropic liquid crystalline polymers (e.g. the VECTRA® resins from Hoechst Celanese Corporation and XYDAR® resins from Amoco), and mixtures of these polymers. Preferred polymers include poly(etherimide), poly(ethylene terephthalate), poly(1,4-cyclohexanedimethylene terephthalate), poly(ethylene naphthalate), poly(phenylene sulfide), poly(etheretherketone), cycloolefinic copolymer, thermotropic liquid crystalline polymers comprising monomer units derived from 4-hydroxybenzoic acid and 6-hydroxy-2-naphthoic acid (e.g. the VECTRA® LCP resins, specifically the A, C, and E series of products, and mixtures of these.

The high dielectric ceramics that are used have a dielectric constant of at least about 50 when measured at 1.0 GHz of frequency and 20° C. There are many ceramic materials that have dielectric constants above 50. Many of these are titanates of other metals or of a mixture of other metals, sometimes mixed with zirconates, as well as $TiO_2$. Examples of high dielectric ceramics that may be used in this invention include strontium titanate, barium neodymium titanate, barium strontium titanate/magnesium zirconate, titanium dioxide, barium titanate, calcium titanate, barium magnesium titanate, lead zirconium titanate, and mixtures of these.

Preferred ceramics for use in this invention also will have a low loss tangent (also referred to as dielectric loss factor, dielectric loss, or dissipation factor). The low loss tangent is beneficial and often necessary to reduce noise and to minimize signal loss in applications at high frequencies (above about 500 MHz). Preferred ceramics include strontium titanate, barium neodymium titanate, and barium strontium titanate/magnesium zirconate.

The ceramic materials that may be used in this invention are well known in the art. Many are commercially available. Others are readily synthesized by known methods. For example, the metal titanates can be made by sintering the metal oxides (e.g., for the preferred ceramics, oxides of Sr, Ba, Nd, Zr and/or Mg) and $TiO_2$ in the stoichiometric ratio needed to obtain the desired product. The ratio of metals in the mixed metal titanates can be optimized to achieve the desired loss tangent and dielectric constant. See for example "Ceramic Dielectrics And Capacitors," by J. M. Herbert, Gordon and Breach Science Publishers, New York, 1985, for more details on synthetic methods. Strontium titanate is available from several manufacturers. Strontium titanate and barium neodymium titanate are both available from Tam Ceramics, Niagara Falls, N.Y., and are sold as TICON™55 and COG900MW respectively. The commercial barium neodymium titanate has a Ba:Nd atomic ratio of about 1, with a small amount of Bi (<10% compared with Ba or Nd)

and enough Ti to balance the titanate stoichiometry. This material has a dielectric constant of about 92 and a loss tangent of about 0.001 at 1.0 GHz. The dielectric constant of this ceramic has a very small thermal coefficient. A preferred barium strontium titanate/magnesium zirconate can be made by sintering about 68% by weight $BaTiO_3$, about 28% by weight $SrTiO_3$, and about 3% $MgZrO_3$, or by sintering a mixture of the oxides.

Strontium titanate ($SrTiO_3$) is a preferred high dielectric ceramic for many uses. It is particularly useful in poly (phenylene sulfide). It is readily compounded with poly (phenylene sulfide) and/or other thermoplastic polymers to yield high dielectric compositions that are readily fabricated into shaped articles by such methods as injection molding and extrusion of films or sheets. It is preferably used as a powder having an average particle size in the range of about 0.2 microns to about 10 microns, preferably about 1 to about 2 microns. Larger or smaller particle sizes can also be used, depending on the size and shape of the article to be fabricated. The electrical properties are easily fine-tuned for specific applications by adjusting the amount of $SrTiO_3$. The loss tangent is low at all levels of $SrTiO_3$, generally not exceeding 0.003 at a frequency of 1.0 GHz. Furthermore, because of the ease of mixing and injection molding these compositions, specific compositions can be made that give reproducible dielectric constants. Thus, for example, the compositions containing 19% of $SrTiO_3$ in poly(phenylene sulfide) on a volume basis have a dielectric constant of 6.03, with a standard deviation of 0.135 for 100 sample data points.

The second filler in these polymeric compositions has a dielectric constant of at least about 5. The dielectric constant of the second filler has a temperature coefficient that is opposite in sign from the temperature coefficient of the high dielectric filler. The second ceramic material can have a high dielectric constant also. Thus for example, the dielectric constant of $BaTiO_3$ has a high dielectric constant and a positive temperature coefficient, whereas $SrTiO_3$ has a negative temperature coefficient. The two ceramics together can have a very high dielectric constant, which varies little with temperature. In general, however, the second ceramic material will have a lower dielectric constant (e.g. in the range of about 5 to 10) because it is desirable to add a larger amount of filler to reduce the CTE. When a ceramic is used that has a lower dielectric constant, more filler is needed. The more highly filled thermoplastic polymers have a lower coefficient of thermal expansion (CTE), reducing problems related to differences in CTE between substrates and copper layers. The preferred second ceramic materials are alumina, magnesium titanate, and mica, all of which give good results with respect to both CTE and temperature compensation of dielectric constant.

Other additives may also be included in the polymeric composition in addition to the high dielectric ceramic and the second ceramic material. These include antioxidants, mold lubricants, light stabilizers, mold release agents, colorants, sizing and coupling agents, other reinforcing fillers, such as glass fiber, and ceramic materials having a low loss tangent, but which are not included as either the high dielectric ceramic or the second ceramic material. These other ceramic materials (excluding reinforcing fillers) would be included at a level of no more than about 5 volume %. Glass fiber has a very low dielectric constant (about 3) and has little effect on the dielectric constant. It is however excellent for reinforcement.

The ceramic fillers (i.e. the high dielectric ceramic and the second ceramic material together), make up about 10% to about 70% by volume of the polymeric composition, preferably about 20% to about 70% by volume, and most preferably about 30% to about 70% by volume. Particularly, when low CTE is important, the amounts of fillers will be adjusted so that the polymeric compositions contain about 30% to about 70% by volume of ceramic fillers.

The high dielectric polymer compositions are made by standard methods for making compounds of polymers and fillers. These methods typically involve mixing the filler and polymer at a temperature high enough to melt the polymer. Compounding of the polymer and ceramic filler in a twin screw extruder is the preferred method.

The polymeric compositions are readily made into shaped articles. The compositions may be shaped into films, sheets, plaques, disks, and other flat shapes which are particularly useful as substrates in electronics (e.g. printed circuit boards). Three dimensional shapes may also be made. The polymers may be shaped by many processes, such as extrusion, injection molding, and compression molding. Films and sheets typically are made by injection molding or extrusion processes.

Laminates having a high dielectric constant and low loss tangent are also readily made from these polymer compositions. Such laminates are particularly useful in making rf circuits, such as antennas, filters, couplers, splitters, and the like. The laminates generally have a flat substrate of the polymeric composition described above, such as a sheet, film, or plaque, placed between two layers of copper or other metal. The metal has not necessarily been applied by a lamination process, so that the term "laminates" has a broader meaning and includes multilayer structures made by methods other than lamination. The flat substrates have two surfaces, other than the edges. The thickness of the substrate is a matter of choice, depending on the application, but generally will be in the range of about 1 mil to about 500 mils.

At least one of the surfaces of the flat substrate has a metal layer adhering to it, and generally both surfaces have a metal layer. The metal is present as an electrical conductor. Copper is the preferred metal, but others may be used, such as gold, titanium, silver and alloys thereof or with copper. The metal may be included in the form of a coating which has been applied by a coating process, such as vapor deposition or sputtering, or by electroplating onto a sheet whose surface has been activated for electroplating. The preferred method of applying the metal is by an actual lamination process, whereby metal film or foil is laminated onto the surfaces of the substrates. The metal film or foil is thin, generally being in the range of about ⅛ mil to about 12 mils, yielding a laminate with the same thickness of metal. The words "foil" and "film" are used interchangably herein when describing metal films and foils. The metal is laminated onto the filled polymer sheet (e.g. poly(phenylene sulfide) by the use of an adhesive or by heating the polymer to the melt temperature while the metal film or foil is pressed against the polymeric sheet. Alternatively, the metal film or foil can be laminated onto a freshly extruded sheet of filled polymer while the sheet is still in a molten or softened state by co-feeding the metal film or foil with the polymer sheet as it emerges from the die of the extruder and passing the metal film or foil and polymer sheet through an apparatus that applies pressure, such as a set of rollers. Another method of making a laminate directly from molten polymer is to place the metal film or foil against the inner walls of a mold and then feed molten polymer into the mold under pressure in an injection molding process. The pressure of the molding process results in a laminate with good adhesion after the polymer cools and hardens. The preferred method is application of the metal foil or film under heat and pressure to a preformed polymer substrate. The preferred metal foil has a matte surface on one side to facilitate adhesion between the metal and the polymer. Foil can be obtained in which the matte surface has a surface profile with an arithmetic mean roughness value of about 1 micron and a mean peak to valley height of about 10 microns. These give acceptable adhesion. Foils can also be obtained that have been treated to increase the surface roughness on the matte side. These give better adhesion and are preferred.

As stated earlier, a low coefficient of thermal expansion is often necessary in making laminates to avoid warping. Warping can result from a large mismatch between the CTE of the flat substrate and the copper that is laminated to it. As long as there is copper on both surfaces of the substrate, there is no warping, even though there are forces resulting from a mismatch in CTE values. As copper is removed from one surface during subsequent manipulations, the laminate can bend. The high level of fillers in the polymeric compositions and the laminates results in a reduced CTE, which is closer to the CTE of the copper, resulting in reduced stresses and reduced warpage.

The dielectric laminates can be stacked and interconnected so that multiple layers are present. The layers may have different dielectric constants and different thickness, to form substrates for multichip modules and circuit boards.

The high dielectric composites and laminates have many uses. For example, sheets, films, plaques, and the like may all be used as substrates for making printed circuit boards that are useable at microwave frequencies. Other uses for flat substrates include high energy density capacitors, filters, antennas, buried components, and multichip modules. An application for which these materials are particularly useful is printed circuit antennas, such as microstrip, dipole, and patch antennas, for wireless equipment. These kinds of antennas are typically flat because the substrate is a ceramic, and their emitted signals and response to received signals are therefore directional. These materials can easily be made in curved or other shaped forms so that the directionality of the antenna response (either transmitting or receiving) can be modified as desired. Other applications include printed (stripline or microstrip) rf and microwave circuit elements, such as transmission lines, inductors, capacitors, filters, (e.g. low pass filters, high pass filters, band pass filters, and band stop filters), signal couplers, branch line couplers, power splitters, signal splitters, impedance transformers, half wave and quarter wave transformers, and impedance matching circuits.

The invention is further illustrated by the following non-limiting examples. These examples all use poly (phenylene sulfide) as the thermoplastic polymer, but high dielectric compositions having temperature compensation can be made from other polymers as well, as described previously herein.

EXAMPLES 1-3

A series of three composites of poly(phenylene sulfide) and strontium titanate were made with the proportions shown in Table 1. FORTRON® W205 poly(phenylene sulfide), obtained from Hoechst Celanese Corporation, Bridgewater, N.J., was compounded in a BARTSTOFF™ or HAAKE™ melt mixer at 285°–290° C. for about 5 minutes with TICON™ 55 strontium titanate, purchased from Tam Ceramics, Inc., 4511 Hyde Park Boulevard, Niagara Falls, N.Y. 14305. The compounded product was extruded into water and pelletized. The ceramic before compounding was a powder having an average particle size ranging from about 1 to about 2 microns (as measured using a Fisher sub-sieve sizer).

The pelletized compounds were then made into plaques (6"×6"×⅛" and 6"×6"×¹⁄₁₆") and ⅛" thick (2–2½" in diameter) discs by injection molding using DEMAG and BOY30M injection molding machines respectively at a melt temperature of about 300° C. The dielectric constants ($D_k$) and loss tangents of the plaques were measured as a function of frequency at room temperature (20° C.). The dielectric constants and loss tangents at 1 MHz were measured using a Hewlett Packard HP 4192ALF Impedence Analyzer and HP 1645B dielectric fixture. The dielectric constants and loss tangents at 1, 2, and 5 GHz were measured by the cavity resonance technique according to ASTM Test Method No. D2520, Method B. These data are presented in Table 1. For comparison, the dielectric constant and loss tangent of poly(phenylene sulfide) at 1.0 GHz are 3.13 and 0.0021 respectively.

EXAMPLE 4

Compounds of barium neodymium titanate and FORTRON W205 poly(phenylene sulfide) were made by the same method as in Examples 1–3. The barium neodymium titanate was obtained from Tam Ceramics, Niagara Falls, N.Y., as a powder with a particle size in the range of about 0.2 microns to about 10 microns, and was sold under the label COG900MW. The barium neodymium titanate has an approximate Ba:Nd atomic ratio of about 1, with a small amount of bismuth (<10% compared with Ba or Nd), and enough Ti to make the titanate stoichiometry. The powder has a dielectric constant of about 92 at 1.0 GHz and a loss tangent of about 0.001 at 1.0 GHz. Two compounds were made, containing the barium neodymium titanate at the levels shown in Table 2. These were made into ⅛" thick discs that were about 2"–2½" in diameter. The dielectric constant and loss tangent were measured for the discs at 1.0 GHz by the method described in Examples 1–3. It can be seen that the loss tangents are about as low or lower than those measured for composites containing $SrTiO_3$.

EXAMPLE 5

For many applications, such as capacitors, the high dielectric/low loss composites will be used as laminates in which a substrate, which may be a film, sheet, plaque, or the like, is laminated between two layers of copper film. Laminates are generally made by one of the following procedures:

(a) Application of heat and pressure. A piece of molded composite sheet (6"×6"×¹⁄₁₆") consisting of FORTRON® W205 resin compounded with TICON55 strontium titanate was sandwiched between two pieces of copper foil. The copper foil was obtained from Gould Inc., Foil Division, Eastlake, Ohio, as JTC Grade 1. Experiments were carried out using samples of both ½ ounce and one ounce copper foil, having a thickness of about 18 microns and 35 microns, respectively. The foil had a matte surface on one side with a surface profile having an arithmetic mean roughness value of about 1 micron and a mean peak to valley height of about 10 microns. Tests were also carried out using copper foil that had been treated by the manufacturer to increase the roughness of the matte surface. The treated copper foil was sold as JTC Grade 3. The three layers (composite and foil) were placed under a pressure of about 55 psi under a vacuum (less than 100 Torr) in a static vacuum press and slowly heated over 50 minutes to a temperature of about 300° C., which is above the melt temperature of the polymer. The heating was stopped as soon as the sample reached 302° C., and the sample was then allowed to cool back down to about 65° C. over a time of about 20 minutes.

Adhesion is measured by a 180° pull test carried out according to the following method. The copper on the plaque is cut so that it can be peeled in one inch wide strips. Peeling of the strip from the plaque is started manually and is then continued while the resistance to peeling is measured. The peeling is carried out at an angle of 180° (i.e. parallel to the surface of the plaque) at a speed of 0.5 inches/minute. The adhesion is reported as the force per inch width of copper needed to peel the copper. The adhesion of the copper laminated to the poly(phenylene sulfide)/$SrTiO_3$ composites as described above was in the range of about 3.5–4.2 lbs/inch using this method. Copper foil that had been subjected to a surface treatment that increased the surface roughness to improve adhesion (JTC Grade 3) was also laminated onto the composite plaques using the same method. The peel strength was much higher (greater than about 10 lbs/inch).

(b) Copper film also can be applied to the poly(phenylene sulfide)/strontium titanate substrates by use of an adhesive. An adhesive that works well for this is C-Flex™ adhesive, which is available from Courtaids Performance Films Co. The adhesive is applied between each of the two layers of copper foil and the two surfaces of the substrate. The copper and substrate are then heated under a pressure of about 140 psi at 204° C. for one hour using the same static vacuum press that was utilized in Example 4(a). The adhesion was measured using the 180° pull test described above and was about 5–6 lbs/inch.

(c) A copper layer may also be applied by electroplating a substrate that has been modified to make electroplating feasible. Alternatively, copper can be applied by sputtering or vapor deposition. The layers made by sputtering and vapor deposition are normally very thin. The layers applied by electroplating can be made thick as well as thin.

(d) Laminates can also be made directly in one step by placing a copper film or sheet into the cavity of a mold and then injection molding a composition containing poly(phenylene sulfide) and one or more fillers into the mold. The copper film is held in place by using an adhesive tape (e.g. KAPTON® film with adhesive on both sides). As the molten polymer is forced into the mold, the copper is pressed firmly between the mold and the molten polymer. As the polymer solidifies, a laminate is formed. In a typical example, an 8 oz HPM injection molding machine with a 150 ton clamping capacity is used to make 6"×6"×0.125" laminates from either 1 ounce or ½ ounce JTC Grade 3 copper film from Gould, Inc. and poly(phenylene sulfide) containing $SrTiO_3$ and mica. Barrel temperature is set to achieve a melt temperature of 320° C. The temperatures of the mold halves are between 120° C. and 140° C. A slow injection speed, corresponding to about 30% of the maximum capacity, is used to achieve the maximum balance of molded part properties and laminate appearance. The mold is injected at 4000 psi and is held under pressure at 3000 psi for 15 seconds. The part is allowed to cool for 40 seconds before being ejected from the mold. The cycle is completed in about 65 seconds.

(e) Laminates can also be made directly from polymer and metal film by extruding the polymer to form one or more layers of film, co-feeding one or more layers of metal film, and pressing the metal film and freshly extruded polymer film which is still in a molten or softened state, to produce a laminate. The method is most typically used to apply a layer of metal film to both surfaces of a polymer film to make a polymer laminate with a metal layer on both sides. It can also be used to make a laminate with a metal layer on one surface or to make laminates having multiple layers of polymer and metal film.

As an example, a composition containing 62% by volume of poly(phenylene sulfide), 14% by volume of $SrTiO_3$, and 24% by volume of mica, described previously, is laminated to a layer of JTC Grade 3 copper foil (1-ounce or ½-ounce) from Gould, Inc. as follows. The polymeric composition is dried in a vacuum dryer at 135° C. for four hours. It is then fed through a gravity fed hopper into a single screw extruder with a 3.5" barrel diameter. The extruder barrel temperatures range from 280° C. in the feed zone to 300° C. in the metering zone. A melt pump is used to provide an even polymer flow to the die. The melt pump and melt lines are maintained at 300° C., while the die temperature is 310° C., and the gap between the die lips is ⅛ inch, which produces a ⅛ inch thick sheet. The melt web is extruded vertically downward between the first two rolls of a horizontal 3-roll stack. The chrome surfaced rolls have a diameter of 18" and the gap between rolls 1 and 2 is ⅛ inch. The web follows a standard S-wrap and exits the roll stack in solid form. The roll temperatures are maintained at 70° C. by circulating oil. A laminate having copper on one side is made by feeding a sheet of copper foil between the molten web and the middle roll of the 3-roll stack. Laminates having copper on both sides are made by feeding copper foil on both sides of the molten web. The laminated sheet then passes through a pair of rubber pull rolls and into a shear blade cutter, which chops the sheet into the desired length. The copper has good adhesion to the sheet.

EXAMPLE 6

Some of the physical and electrical properties of a composite containing 30 volume % of TICON®55 strontium titanate powder in FORTRON®W205 poly(phenylene sulfide) are summarized below.

The moisture absorption of the material was measured as 0.01% by ASTM Method D570. The dielectric constant was measured in the machine direction (direction of flow during molding) and normal to the machine direction to determine whether there was any variation (i.e. anisotropy) of dielectric properties. The dielectric constant was the same (within 3%) in the two directions, indicating that there was little or no dielectric anisotropy.

The temperature dependence of the dielectric constant of poly(phenylene sulfide)/strontium titanate sheet was measured over the temperature range of −50° C. to 100° C. Two samples contained about 30% by volume of strontium titanate. The dielectric constant showed some variation with temperature, varying from about 10.5 at −50° C. to about 9.8 at 100° C. for one sample, and 10.1 at −50° C. to 9.5 at 100° C., for the second sample. At 24° C., the dielectric constant of the two samples were about 10.1 and 9.7 respectively. The loss tangent varied more with temperature; for both samples, at −50°, the loss tangent was about 0.0014; at room temperature, the loss tangent was about 0.0020, and at 100° C., the loss tangent was about 0.0023.

Finally, a sample of a composite of 30 volume % of strontium titanate in poly(phenylene sulfide) was subjected to dynamic mechanical analysis over the range of about 30° C. to about 250° C. The storage modulus of the sheet (non-laminated) was about 9.8 GPa at about 40° C., whereas the storage modulus of a laminated sample was about 11 GPa at 40° C. Thus, the plaques were actually reinforced somewhat when the copper foil was laminated onto them.

EXAMPLE 7

TICON™55 strontium titanate powder (2.53 pounds), mica (0.766 pounds), and FORTON® W205 poly(phenylene sulfide) powder (2.71 pounds) were compounded in a Brabender twin screw extruder, generally using the method of Examples 1–3, to make a compound having 20% by volume strontium titanate, 10% by volume mica, and 70% by volume poly(phenylene sulfide). The mica was obtained from KMG Minerals, Inc., Kings Mountain, N.C. 28086, and was designated L-140. The mica was in the form of platelets having an average particle size of about 70 microns. The die temperature of the extruder was 285°–300° C., and the screw speed was 60 rpm. The compound of mica, strontium titanate, o and poly(phenylene sulfide) was made into 1/16" thick plaques by the method of Examples 1–3. The plaques were then made into laminates by applying a film of either 1 ounce or ½ ounce JTC Grade 3 copper film, obtained from Gould Inc., to the plaques by the application of heat and pressure, following the method of Example 5 (a).

EXAMPLES 8–17

Laminates based on other compositions of mica, strontium titanate, and polyphenylene sulfide were made, generally according to the method of Example 7. In Example 17, FORTRON® W203 was used. In Examples 16 and 17, a different grade of mica was used (L-135, having an average particle size of about 250 microns).

The plaques of Example 7–17 were then subjected to various tests to determine the dielectric and mechanical properties. The coefficient of thermal expansion (CTE) was measured according to ASTM E-831-86 using a dynamic mechanical analyzer. The CTE of the plaque was measured in three directions: (1) The machine direction (also referred to as the flow direction or x-direction); (2) the transverse direction, perpendicular to the flow direction and in the plane of the plaque (also referred to as the y-direction); (3) perpendicular to the plane of the plaque (the z-direction). The flexural strength and flexural modules were measured using ASTM Method D790. The heat distortion temperature (HDT) under a 264 psi load was measured by ASTM Method D648. The dielectric constant and the loss tangent at 1 GHz were measured by the methods described in Examples 1–3. The moisture absorption of the plaque was measured by ASTM Method 570. The data for Examples 7–17 are tabulated in Table 3.

In Table 3, it can be seen that there was very little or no anisotropy in the dielectric constant and loss tangent measurements in the xy-plane. The loss tangent was also low, with the maximum measurement being about 0.0022. The coefficient of thermal expansion showed some anisotropy in the x and y directions, but the CTE values were generally less than 30 ppm/°C., which was deemed to be sufficiently low to prevent warpage and bending of the laminates. The CTE values were measured over the temperature range of –30° to 230° C. The CTE in the z-direction was measured at –30° to 80° C. and at 80° to 230° C. Both values are reported in Table 3. There is a large increase at about 80° C., the Tg of the polymer. It is also noteworthy that the water absorption is low, in view of the fact that mica can absorb moisture.

For comparison, two samples of FORTRON W-205 poly (phenylene sulfide) and SrTiO₃ (43.5 wt %), but without mica, were made into plaques and were then subjected to some of the same tests of physical properties. These are reported as Control 1 and Control 2 in Table 3. The composites with SrTiO₃ but without mica have a much higher CTE (53.5–59.6 ppm/°C. in the plane of the plaque) than the composites that contain mica. The composites containing mica and SrTiO₃ also have higher heat distortion temperatures and flexural moduli than those that contain only SrTiO₃.

EXAMPLES 18–21

Further comparative data were generated by making compounds of FORTRON W-205 poly(phenylene sulfide), glass fiber, and SrTiO₃. These were produced by compounding FORTRON 1140L6 40% by weight glass-filled poly (phenylene sulfide) and FORTRON W205 polyphenylene sulfide (unfilled) with SrTiO₃ to achieve the desired ratio of glass, SrTiO₃, and polymer. The relative volumes were then calculated for comparison purposes. These were made into 1/16" thick plaques, which were then made into laminates. The plaques were tested using the same methods that were used for the mica-filled plaques. The data are reported in Table 4. The four samples are listed as Examples 18–21. The CTE values are much higher than those of the mica-filled compositions. The flexural strengths and heat distortion temperatures are also higher than those of the mica-filled compositions, which had higher flexural modulus values. The dielectric constants showed a greater anisotropy between the x and y directions than the mica-filled compositions. The loss tangents for the glass fiber-filled compositions were also higher than for the mica-filled compositions (0.0023–0.0031 for the glass fiber-filled compositions, compared with less than 0.0022 for all of the mica-filled composition).

EXAMPLE 22

For further comparison, glass flake was also tested as a reinforcing filler. The glass flake was sold under the name Hammermilled FLAKEGLAS™ 74×59647, and was obtained from Owens Corning, Huntington, Pa. The average particle diameter was 0.4mm. Glass flake, SrTiO₃, and FORTRON W-205 poly(phenylene sulfide) were compounded in a twin screw extruder using the same general method described above. The compounds were made into plaques and laminates using the methods described above and subjected to the same tests. A compound of 62 volume % poly(phenylene sulfide), 18 volume % glass flake, and 20 volume % SrTiO₃ had CTE in the x, y and z directions of 30.2, 35.6 and 43–139 ppm/°C., measured over a temperature range of –30° C. to 230° C. The flexural strength and modulus of the plaques were 16.41 ksi and 1.74 Msi. The heat distortion temperature was 209° C. The dielectric constant was 7.34 and 7.47 in the x and y directions. The loss tangent was 0.0031 and 0.0030 in the x and y directions. The Water Absorption was 0.02%. The CTE's in the x-y plane are lower (30.6–35.6) than with glass fiber, but still are higher than the CTE values of the mica-filled and alumina-filled compositions, which are generally less than 30. The physical properties (flexural modulus, heat distortion temperature) were somewhat improved over compositions with only SrTiO₃. The flexural modulus values and heat distortion temperatures were much lower than those of the mica-filled compositions. The dielectric constant showed a greater anisotropy in the x and y directions than was observed for mica and SrTiO$_3$. The loss tangent values for the glass flake-filled compositions were higher (0.0030-0.0031) than those of the mica-filled compositions (less than 0.0022).

EXAMPLES 23-26

A series of compounds of FORTRON W205 poly (phenylene sulfide), alumina, and either TICON 55 strontium titanate or barium neodymium titanate (COG900MW, from Tam Ceramics) were prepared in a Brabender twin screw extruder. These were made into ⅛" thick discs having a diameter of 2 inches on a BOY30M injection molding machine. Physical and dielectric properties were measured by the methods used in previous examples. Four samples were made. The data are tabulated in Table 5. The dielectric constants were measured at 20° C. at 2 GHz frequency. The alumina used in these experiments was obtained from Alcoa Industrial Chemicals Division, Bauxite, Ark. In Examples 23 and 24, the alumina was calcined alumina, Realox Reactive Grade A-500, which has a median particle size of 3.6 microns. In Examples 25 and 26, the alumina was low soda calcined alumina Grade A-10, which has a median particle size of 6-10 microns.

In these examples, the CTE in the z-direction is low and appears constant (within experimental error) with temperature over the range -30° to 80° C. The loss tangents were also low, with a maximum of 0.0029 in the examples. The dielectric constants of Examples 23, 24, and 25 were measured as a function of temperature and were constant (within experimental error). Over the temperature range of -40° C. to 85° C., the dielectric constant of Example 23 averaged from 6.02-6.18, the dielectric constant of Example 24 ranged from 5.78-5.93, and the dielectric constant of Example 25 ranged from 6.60-6.88.

EXAMPLE 26A

Compositions containing SrTiO$_3$ and mica also exhibit dielectric constants that are relatively unchanged with temperature. Thus, a disc was made from a composition of 62 volume % of FORTRON W205 poly(phenylene sulfide), 14 volume % of SrTiO$_3$, and 24 volume % of mica. The dielectric constant ranged from 6.26-6.39 when measured at several temperatures from -40° C. to 85° C.

EXAMPLES 27-29

Three compositions were made having a dielectric constant of about 9-10, by the methods previously described. The compositions were made into ⅛" thick × about 2" diameter discs for testing of electrical properties and CTE. The compositions and results follow:

EXAMPLE 27

50 Volume % poly(phenylene sulfide) (PPS)/25 volume % SrTiO$_3$/25 volume % Mica has a dielectric constant in the xy-plane of 9.31, measured at 2 GHz at 20° C. There was no variation of the dielectric constant over the temperature range -40° C. to 85° C. within experimental error (measured values were 9.49-9.14). The loss tangent in the xy-plane at 2 GHz is 0.002, and the CTE in the z-direction is 32.92 ppm/°C.

EXAMPLE 28

50 Volume % PPS/25 volume % SrTiO$_3$/25 volume % alumina has a dielectric constant in the xy-plane of 10.27, measured at 2 GHz at 20° C. There was no variation in the dielectric constant over the range -40° C. to 85° C. within experimental error (measured values 10.58-10.16). The loss tangent in the xy-plane at 2 GHz is 0.002, and the CTE in the z-direction is 20.71 ppm/°C.

EXAMPLE 29

50 Volume % PPS/20 volume % SrTiO$_3$/30 volume % alumina has a dielectric constant in the xy-plane of 9.07, measured at 2 GHz at 20° C. There was no variation in the dielectric constant over the temperature range of -40° C. to 85° C. within experimental error (measured values 8.98-9.30). The loss tangent at 2 GHz in the xy-plane is 0.0019, and the CTE in the z-direction is 21.01 ppm/°C.

EXAMPLES 30-31

Two compositions were made in which MgTiO$_3$ (purchased from Tam Ceramics) was included as the added filler. Barium neodymium titanate (COG900MW, from Tam Ceramics) was the high dielectric filler in these examples. The compositions were made by melt blending, as previously described for other compositions. The blended compositions were made into ⅛" thick ×2" diameter discs for testing of electrical properties and CTE. The results follow:

EXAMPLE 30

A composition was made comprising 55 volume % PPS, 8 volume % barium neodymium titanate, and 37 volume % magnesium titanate. The dielectric constant in the xy-plane was 6.81 at 20° C. There was no variation in the dielectric constant over the temperature range -40° C. to 85° C. within experimental error (measured values 6.87-6.81). The loss tangent in the xy-plane is 0.0015 at 2 GHz. The CTE in the z-direction is 24.56 ppm/°C.

EXAMPLE 31

The composition comprises 53 volume % PPS, 39 volume % MgTiO$_3$, and 8 volume % barium neodymium titanate. The dielectric constant in the xy-plane at 20° C. was 7.06. There was no variation in dielectric constant within experimental error over the temperature range -40° C. to 85° C. (measured values 6.99-7.12). The loss tangent in the xy-plane is 0.0015 at 2 GHz, and the CTE in the z-direction is 25.37 ppm/°C.

The dielectric constant of compositions of SrTiO$_3$ and PPS without a second filler varies much more with temperature than that of compositions containing alumina and/or mica. (See Example 6). The low variation of dielectric constant with temperature for SrTiO$_3$ or barium neodymium titanate with either mica, alumina, or magnesium titanate, as a second filler in poly(phenylene sulfide) is useful for devices which may be exposed to a variety of temperatures (e.g. outdoor use).

It is to be understood that the above-described embodiments of the invention are illustrative only and that modification throughout may occur to one skilled in the art. Accordingly, this invention is not to be regarded as limited to the embodiments described herein.

TABLE 1

Dielectric Constants of Poly(Phenylene sulfide)/SrTiO3 Composites

| | Ceramic Content | | Dielectric Constant | | | | Loss Tangent | | | |
|---|---|---|---|---|---|---|---|---|---|---|
| Example No. | Volume % | Weight % | 1 MHz | 1 GHz | 2 GHz | 5 GHz | 1 MHz | 1 GHz | 2 GHz | 5 GHz |
| 1 | 19 | 43.5 | — | 6.38 | 6.37 | — | — | 0.0023 | 0.0023 | — |
| 2 | 30 | 58.5 | 9.0 | 10.0 | 9.9 | 10.0 | <0.001 | 0.0022 | 0.0020 | 0.0029 |
| 3 | 40 | 68.7 | 14.0 | 15.4 | 15.3 | 15.4 | <0.001 | 0.0020 | 0.0018 | 0.0027 |

TABLE 2

Dielectric Properties of Composites

| Amount of BaNdTiO$_3$ | | Dielectric Properties at 1.0 GHz | |
|---|---|---|---|
| Volume % | Weight % | Dielectric Constant | Loss Tangent |
| 20 | 48.83 | 6.04 | 0.0019 |
| 30 | 64.47 | 8.52 | 0.0016 |

TABLE 3

Properties of Mica-Filled Plaques

| | Composition (vol %) | | | | Flex Str./ | | Dielectric[2] | Loss[3] | |
|---|---|---|---|---|---|---|---|---|---|
| Example | PPS (vol %) | Mica (vol %) | SrTiO$_3$ (vol %) | CTE[1] | Flex Mod (ksi/Msi) | HDT (°C.) | Constant (1 GHz) | Tangent (1 GHz) | Water Absorption |
| 7 | 70 | 10 | 20 | — | 14.93/1.54 | 200 | 7.21; 7.34 | 0.0021; 0.0020 | 0.06% |
| 8 | 63 | 20 | 17 | 37.4/30.8/NA | 15.23/2.19 | 223 | 7.28; 7.25 | 0.0018; 0.0018 | 0.03% |
| 9 | 68 | 20 | 12 | — | — | — | 5.73; 5.72 | 0.0022; 0.0021 | 0.03% |
| 10 | 64 | 24 | 12 | 15.5/26.4/46–167 | — | — | 5.92; 5.94 | 0.002; 0.002 | 0.04% |
| 11 | 68 | 20 | 12 | — | 15.34/2.14 | 241 | 5.78; 5.74 | 0.0022; 0.0021 | 0.04% |
| 12 | 64 | 24 | 12 | 20.2/26.0/42–149 | 16.15/2.45 | 248 | 5.78; 5.83 | 0.0021; 0.0021 | 0.04% |
| 13 | 58 | 30 | 12 | 19.1/28.8/34–123 | 15.21/2.78 | 253 | 6.20; 6.11 | 0.0019; 0.0019 | 0.05% |
| 14 | 66 | 20 | 14 | — | — | — | 6.30; 6.27 | 0.002; 0.002 | 0.03% |
| 15 | 67 | 20 | 13 | — | — | — | 6.16; 6.05 | 0.0015; 0.0013 | 0.03% |
| 16 | 64 | 24 | 12 | — | — | — | 5.80; 5.81 | 0.0017; 0.0016 | 0.05% |
| 17 | 64 | 24 | 12 | 19.9/27.1/51–162 | 14.54/2.57 | 254 | 5.87; 5.80 | 0.0016; 0.0017 | 0.05% |
| Cntrl 1[4] | 81 | 0 | 19 | 59.6/58.9/NA | 18.0/0.92 | 135 | NA[5] | NA | NA |
| Cntrl 2[4] | 81 | 0 | 19 | 59.5/53.5/28–104 | 15.9/0.93 | 151 | NA[5] | NA | NA |

[1]ppm/°C., measured in the x, y, and z directions over the temperature range of −30° to 230° C. The two z-direction values are at −30° to 80° C. and at 80° to 230° C., respectively.
[2]Measured in x and y directions.
[3]Measured in x and y directions.
[4]Controls.
[5]About 6.

TABLE 4

Glass Fiber/SrTiO$_3$/PPS Compositions

| | Composition (vol %) | | | | Flex Str./ | | Dielectric[2] | Loss[2] | |
|---|---|---|---|---|---|---|---|---|---|
| Example | PPS | Glass Fiber | SrTiO$_3$ | CTE[1] (y,z) | Flex Mod (Ksi/Msi) | HDT (°C.) | Constant (1 GHz) | Tangent (1 GHz) | Water Absorption |
| 18 | 69.20 | 13.8 | 17 | — | 22.33/1.55 | 253 | 7.11, 7.31 | 0.0023, 0.0024 | 0.01% |
| 19 | 70.68 | 11.32 | 18 | — | 21.24/1.45 | 250 | 6.79, 7.03 | 0.0025, 0.0025 | 0.03% |
| 20 | 72.72 | 8.28 | 19 | 53–117/143–190 | 19.35/1.27 | 236 | 6.86, 7.09 | 0.0024, 0.0024 | 0.02% |
| 21 | 63.30 | 20.7 | 16 | 53/39–171 | 24.97/1.98 | 261 | 6.97, 6.93 | 0.0031, 0.0031 | 0.02% |

[1]Measured in the y, z, directions over the temperature range of −30° to 230° C. The pairs of measurements are at −30° to 80° C. and 80° to 230° C., respectively. The single value is at −30° to 80° C.
[2]Measured in the x, y direction at 1 GHz.

TABLE 5

Alumina-Filled High Dielectric Composites

| | Composition (vol %) | | | | | Dielectric | Loss |
|---|---|---|---|---|---|---|---|
| Example | PPS (vol %) | Alumina (vol %) | SrTiO$_3$ (vol %) | COG900MW | CTE[1] | Constant (2 GHz) | Tangent (2 GHz) |
| 23 | 52 | 42 | 6 | — | 23.2 | 6.18 | 0.0029 |
| 24 | 56 | 38 | 6 | — | 25.1 | 5.97 | 0.0028 |
| 25 | 52 | 37 | — | 11 | 22.2 | 6.88 | 0.0017 |
| 26 | 54 | 37 | — | 9 | 25.1 | 6.49 | 0.0017 |

[1]Measured in the z-direction, –30° to 80° C.

We claim:

1. A polymeric composition having a high dielectric constant that varies little with temperature, comprising a thermoplastic polymer, a high dielectric ceramic, and a second ceramic material, wherein said high dielectric ceramic is selected from the group consisting of strontium titanate, barium neodymium titanate, and barium strontium titanate/magnesium zirconate, and said second ceramic material is mica, wherein said high dielectric ceramic and said second ceramic material are included in the polymeric composition in sufficient quantity that the dielectric constant of said polymeric composition is at least about 4.0 at 1.0 GHz.

2. The polymeric composition recited in claim 1, wherein said high dielectric ceramic is strontium titanate.

3. The polymeric composition recited in claim 1, wherein said polymeric composition comprises about 10% to about 70% by volume of said high dielectric ceramic and said second ceramic material.

4. The polymeric composition recited in claim 1, wherein said polymeric composition has a heat distortion temperature under a 264 psi load as measured by ASTM Test Method D648 of at least about 80° C.

5. The polymeric composition recited in claim 1, wherein said polymeric composition has a heat distortion temperature under a 264 psi load as measured by ASTM Test Method D648 of at least about 200° C.

6. The polymeric composition recited in claim 1, wherein said thermoplastic polymer is selected from the group consisting of semi-crystalline polymers having a melting point of at least about 200° C., thermotropic liquid crystalline polymers having a melting point of at least about 200° C., amorphous polymers having a glass transition temperature of at least about 80° C., and mixtures thereof.

7. The polymeric composition recited in claim 1, wherein said thermoplastic polymer is selected from the group consisting of polyethylene, ultra-high-molecular weight polyethylene, polystyrene, poly(oxymethylene), polycarbonate, poly(phenylene oxide), poly(etherimide), poly(sulfone), poly(ether sulfone), nylon 6, nylon 66, poly(ethylene terephthalate), poly(1,4-cyclohexanedimethylene terephthalate), poly(ethylene naphthalate), poly(phenylene sulfide), poly(amide imide), poly(etheretherketone), poly(etherketone), cycloolefinic copolymer, thermotropic liquid crystalline polymers, and mixtures thereof.

8. The polymeric composition recited in claim 1, wherein said thermoplastic polymer is selected from the group consisting of poly(etherimide), poly(ethylene terephthalate), poly(1,4-cylcohexanedimethylene terephthalate), poly(ethylene naphthalate), poly(phenylene sulfide), poly(etheretherketone), cycloolefinic copolymer, thermotropic liquid crystalline polymer comprising monomer units derived from 4-hydroxybenzoic acid and 6-hydroxy-2-naphthoic acid, and mixtures thereof.

9. The polymeric composition as recited in claim 1, wherein said high dielectric ceramic is barium neodymium titanate.

10. The polymeric composition as recited in claim 2, wherein said thermoplastic polymer is selected from the group consisting of poly(etherimide), poly(ethylene terephthalate), poly(1,4-cyclohexanedimethylene terephthalate), poly(ethylene naphthalate), poly(phenylene sulfide), poly(etheretherketone), cycloolefinic copolymer, thermotropic liquid crystalline polymer comprising monomer units derived from 4-hydroxybenzoic acid and 6-hydroxy-2-napthoic acid, and mixtures thereof.

11. The polymeric composition as recited in claim 1, wherein said high dielectric ceramic and said second ceramic material together comprise about 20% to about 70% by volume of said polymeric composition.

12. The polymeric composition as recited in claim 1, wherein the dielectric constant of said polymeric composition does not vary by more than about 2% over the range –40° C. to 85° C. from the value at 20° C.

13. The polymeric composition as recited in claim 1, wherein the dielectric constant of said polymeric composition does not vary by more than about 2% over the range –40° C. to 85° C. from the value at 20° C.

14. A laminate having a high dielectric constant with a reduced temperature coefficient comprising:
   (a) a flat substrate comprising the polymeric composition of claim 1, said substrate having two surfaces; and
   (b) at least one layer of metal adhering to at least one surface of said substrate;
   wherein said laminate has a dielectric constant of at least about 4.0 at 1.0 GHz frequency and 20° C., wherein the dielectric constant does not vary by more than about 2% from the value at 20° C. over the temperature range –40° C. to 85° C.

15. A laminate as recited in claim 14, wherein said metal is copper.

16. A laminate as recited in claim 14, wherein said high dielectric ceramic and said second ceramic material together comprise about 10% to about 70% by volume of said polymeric composition.

17. A laminate having a high dielectric constant with a reduced temperature coefficient comprising:
   (a) a flat substrate comprising the polymeric composition of claim 11, said substrate having two surfaces; and
   (b) at least one layer of metal adhering to at least one surface of said substrate;
   wherein said laminate has a dielectric constant of at least about 4.0 at 1.0 GHz frequency and 20° C., wherein the dielectric constant does not vary by more than about 2% from the value at 20° C. over the range –40° C. to 85° C.

18. A high dielectric constant laminate as recited in claim 17, wherein said thermoplastic polymer is selected from the group consisting of poly(phenylene sulfide), cycloolefinic copolymer, thermotropic liquid crystalline polymer comprising monomer units derived from 4-hydroxybenzoic acid and 6-hydroxy-2-naphthoic acid, and mixtures thereof; and said flat substrate comprises two layers of copper, each layer adhering to one of said surfaces of said substrate.

19. A method of making a polymeric composition having a high dielectric constant with a reduced temperature coefficient, comprising the step of compounding a thermoplastic polymer, a high dielectric ceramic, a second ceramic material and optionally other additives, wherein said high dielectric ceramic is selected from the group consisting of strontium titanate, barium neodymium titanate, and barium strontium titanate/magnesium zirconate, and said second ceramic material is mica, wherein said high dielectric ceramic and said second ceramic material are included in the polymeric composition in sufficient quantity that the dielectric constant of said polymeric composition is at least about 4.0 at 1.0 GHz.

20. The method as recited in claim 19, wherein said thermoplastic polymer is selected from the group consisting of polyethylene, ultra-high-molecular weight polyethylene, polystyrene, poly(oxymethylene), polycarbonate, poly(phenylene oxide), poly(etherimide), poly(sulfone), PSO, nylon 6, nylon 66, poly(ethylene terephthalate), poly(1,4-cyclohexanedimethylene terephthalate), poly(ethylene naphthalate), poly(phenylene sulfide), poly(amide imide) poly(etheretherketone), poly(etherketone), cycloolefinic copolymer, thermotropic liquid crystalline polymers, and mixtures thereof.

21. A method of making a laminate having a high dielectric constant with a reduced temperature coefficient, comprising the steps of:
  (a) shaping the polymeric composition recited in claim 1 into a flat substrate, said substrate having two surfaces; and
  (b) applying metal to one or both surfaces of said flat substrate.

22. A capacitor comprising the polymeric composition recited in claim 1.

23. A multichip module comprising the polymeric composition recited in claim 1.

24. A printed circuit antenna comprising the polymeric composition recited in claim 1.

25. A printed rf or microwave circuit element comprising the polymeric composition recited in claim 1.

26. A printed rf or microwave circuit element as recited in claim 25, where said rf or microwave circuit element is selected from the group consisting of transmission lines, inductors, capacitors, filters, signal couplers, branch line couplers, power splitters, signal splitters, impedance transformers, half wave and quarter wave transformers, impedance matching circuits, and mixtures thereof.

27. The polymeric composition as recited in claim 2, wherein said thermoplastic polymer is poly(phenylene sulfide).

28. The polymeric composition as recited in claim 1, wherein the dielectric constant of said polymeric composition does not vary by more than about 1% from the value at 20° C. over the range –40° C. to 85° C.

* * * * *